(12) United States Patent
Colinge

(10) Patent No.: US 9,899,490 B2
(45) Date of Patent: Feb. 20, 2018

(54) SEMICONDUCTOR STRUCTURE WITH CHANGEABLE GATE LENGTH AND METHOD FOR FORMING THE SAME

(71) Applicant: Taiwan Semiconductor Manufacturing Co., Ltd., Hsinchu (TW)

(72) Inventor: Jean-Pierre Colinge, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/014,752

(22) Filed: Feb. 3, 2016

(65) Prior Publication Data

US 2017/0222007 A1 Aug. 3, 2017

(51) Int. Cl.
| | | |
|---|---|---|
| *H01L 29/775* | (2006.01) | |
| *H01L 29/786* | (2006.01) | |
| *H01L 21/335* | (2006.01) | |
| *H01L 21/336* | (2006.01) | |
| *H01L 29/423* | (2006.01) | |
| *H01L 29/66* | (2006.01) | |
| *H01L 29/08* | (2006.01) | |
| *H01L 29/36* | (2006.01) | |
| *H01L 29/06* | (2006.01) | |

(52) U.S. Cl.
CPC .... *H01L 29/42392* (2013.01); *H01L 29/0649* (2013.01); *H01L 29/0847* (2013.01); *H01L 29/36* (2013.01); *H01L 29/66439* (2013.01); *H01L 29/66742* (2013.01); *H01L 29/78681* (2013.01); *H01L 29/78687* (2013.01); *H01L 29/78696* (2013.01); *H01L 29/0673* (2013.01)

(58) Field of Classification Search
CPC .......... H01L 29/42392; H01L 29/0649; H01L 29/0673; H01L 29/0847; H01L 29/66439; H01L 29/66742; H01L 29/78681; H01L 29/78687; H01L 29/78696
USPC ........ 257/9, 24, 38, 347, 401, 463, E29.245, 257/E29.255, E21.404, E21.409; 438/142, 151, 289
See application file for complete search history.

(56) References Cited

U.S. PATENT DOCUMENTS

| | | | |
|---|---|---|---|
| 6,969,659 B1 * | 11/2005 | Anderson | ......... H01L 29/66545 257/346 |
| 8,173,993 B2 * | 5/2012 | Bangsaruntip | ......... B82Y 10/00 257/38 |
| 8,178,862 B2 | 5/2012 | Colinge | |

(Continued)

OTHER PUBLICATIONS

Colinge et al., "Nanowire transistors without junctions", Nature Nanotechnology, Macmillan Publishers Limited, 2010, p. 1-5.

*Primary Examiner* — Dao H Nguyen
(74) *Attorney, Agent, or Firm* — Birch, Stewart, Kolasch & Birch, LLP

(57) ABSTRACT

A semiconductor structure and a method for forming the same are provided. The semiconductor structure includes a substrate and a nanowire structure formed over the substrate. In addition, the nanowire structure includes a first portion, a second portion, and a third portion. The semiconductor structure further includes a gate structure formed around the third portion of the nanowire structure and a source region formed in the first portion of the nanowire structure. In addition, a depletion region in the nanowire structure has a length longer than a length of the gate structure and is not in contact with the source region.

20 Claims, 14 Drawing Sheets

(56) References Cited

U.S. PATENT DOCUMENTS

| | | |
|---|---|---|
| 9,184,269 B2 | 11/2015 | Ching et al. |
| 9,190,505 B2 * | 11/2015 | Hirai .................... H01L 29/778 |
| 2008/0258207 A1 * | 10/2008 | Radosavljevic .. H01L 29/41791 |
| | | 257/327 |
| 2010/0276662 A1 | 11/2010 | Colinge |
| 2011/0315950 A1 * | 12/2011 | Sleight .................. B82Y 10/00 |
| | | 257/9 |
| 2012/0305893 A1 * | 12/2012 | Colinge ............ H01L 29/42392 |
| | | 257/29 |
| 2015/0028389 A1 | 1/2015 | Chen et al. |
| 2015/0069473 A1 * | 3/2015 | Glass ................ H01L 21/02175 |
| | | 257/288 |

* cited by examiner

SEMICONDUCTOR STRUCTURE WITH CHANGEABLE GATE LENGTH AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increasing performance in semiconductor structures is the higher levels of integration of circuits. This is accomplished by miniaturizing or shrinking device sizes on a given chip. For example, the sizes of gate structures in transistors have continually been scaled down. However, although existing processes for manufacturing transistors have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
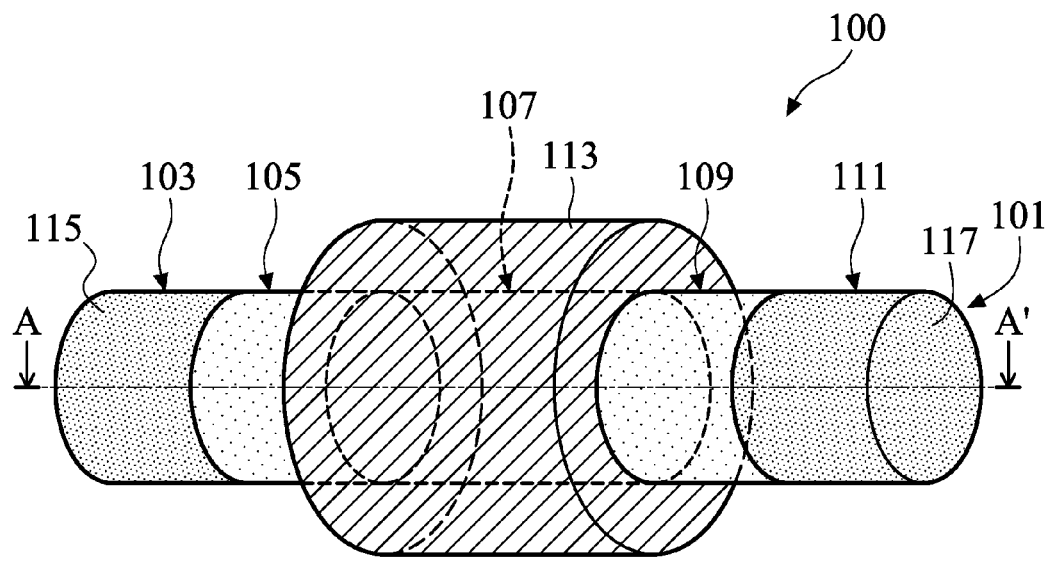
FIG. 1A is a perspective representation of a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided in accordance with some embodiments of the disclosure. The semiconductor structure may include a nanowire structure, a gate structure formed around the nanowire structure, and source/drain regions formed in two ends of the nanowire structure. In addition, the distance between the source/drain region and the gate structure is relatively long so the depletion region induced by the gate structure can extend to a length which is longer than the length of the gate structure. Therefore, the semiconductor structure can have a changeable channel length.

FIG. 1A is a perspective representation of a semiconductor structure 100 in accordance with some embodiments. The semiconductor structure 100 includes a nanowire structure 101, and the nanowire structure includes a first portion 103, a second portion 105, a third portion 107, a fourth portion 109, and a fifth portion 111.

In some embodiments, the nanowire structure 101 is made of Si, Ge, SiGe, a III-V semiconductor material, bismuth-based semiconductor materials, or the like. In some embodiments, the first portion 103, the second portion 105, the third portion 107, the fourth portion 109, and the fifth portion 111 are doped with the same type of dopants, such as N-type dopants or P-type dopants. The dopant concentrations in each portion may be the same or different (Details will be described later).

As shown in FIG. 1A, the third portion 107 is located at the center of the nanowire structure 101, and the first portion 103 and fifth portion 111 are located at two ends of the nanowire structure 101. In addition, the first portion 103 and the third portion 107 of the nanowire structure 101 are separated by the second portion 105, and the fifth portion 111 and the third portion 107 are separated by the fourth portion 109.

A gate structure 113 is formed around the third portion 107 of the nanowire structure 101. In addition, a source region 115 is formed in the first region 103 and a drain region 117 is formed in the fifth region 111. That is, the source region 115 and the gate structure 113 are separated by the second portion 105, and the drain region 117 and the gate structure 113 are separated by the fourth portion 109.

In some embodiments, the source region 115 and the drain region 117 are doped with the same type of dopants which are doped in the nanowire structure 101. In addition, the dopant concentrations in the source region 115 and drain region 117 are greater than the dopant concentrations in the second portion 105, the third portion 107, and the fourth portion 109 of the nanowire structure 101. In some embodiments, the gate structure 113 includes a gate dielectric layer and metal gate stacks formed over the gate dielectric layer. In some embodiments, the gate dielectric layer is made of metal oxides, metal nitrides, metal silicates, transition metal oxides, transition metal nitrides, transition metal silicates, oxynitrides of metals, metal aluminates, or other high-k dielectric materials. Examples of the high-k dielectric material may include, but are not limited to, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, zirconium oxide, titanium oxide, aluminum oxide, or hafnium dioxide-alumina (HfO$_2$—Al$_2$O$_3$) alloy.

In some embodiments, the gate stacks includes a work function metal layer and a gate electrode layer. The work function metal layer may be customized to have the proper work function. For example, if P-type work function metal (P-metal) for a PMOS device is desired, Pt, Ta, Re, N$^+$-polysilicon, TiN, WN, or W may be used. On the other hand, if an N-type work function metal (N-metal) for NMOS devices is desired, Al, P$^+$ polysilicon, Ti, V, Cr, Mn, TiAl, TiAlN, TaN, TaSiN or TaCN, may be used.

In some embodiments, the gate electrode layer is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. In some embodiments, the gate structure 113 is made of polysilicon.

It should be noted that, although the nanowire structure 101 shown in FIG. 1A has a round shape when viewing from the side view, the shape of the nanowire structure 101 is not intended to be limited. For example, the nanowire structure may have a rectangular shape when viewing from the side view in some other examples.

Figure 1B:
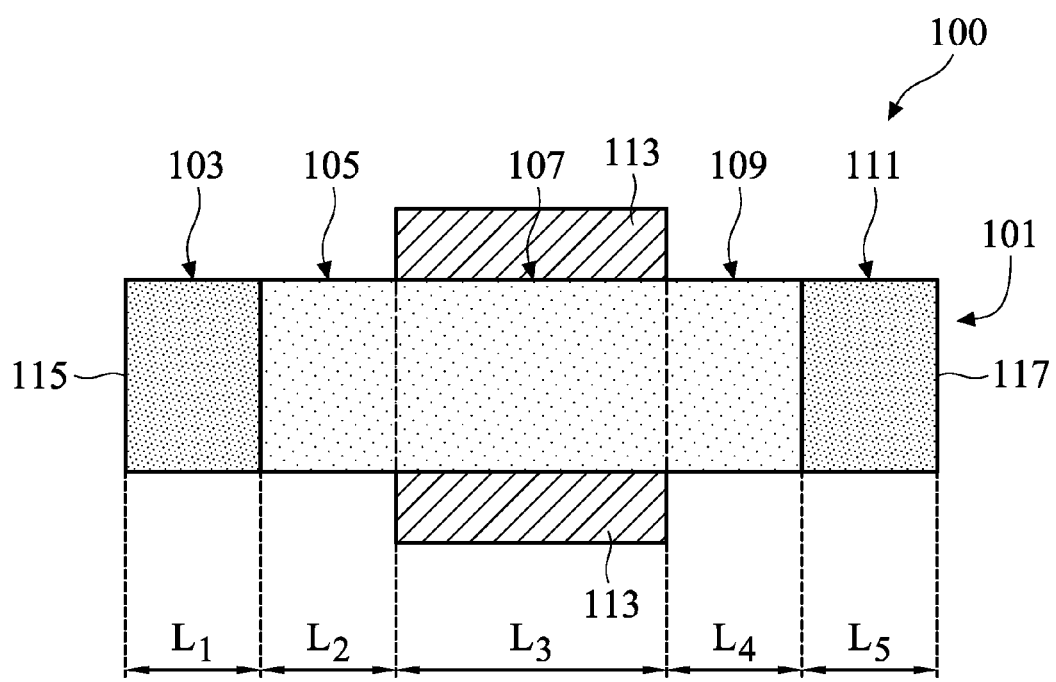
FIG. 1B is a cross-sectional representation of the semiconductor structure along A-A' line shown in FIG. 1A in accordance with some embodiments.

FIG. 1B is a cross-sectional representation of the semiconductor structure 100 along A-A' line shown in FIG. 1A in accordance with some embodiments.

As shown in FIG. 1B, the nanowire structure 101 may be divided into the first portion 103, the second portion 105, the third portion 107, the fourth portion 109, and the fifth portion 111, and they may respectively have a first length L$_1$, a second length L$_2$, a third length L$_3$, a fourth length L$_4$, and a fifth length L$_5$. It should be noted that, the dot-lines between each portion of the nanowire structure 101 are drawn for better understanding the concept of the disclosure. That is, they may not have an actual interface between each portion.

As shown in FIG. 1B, the source region 115 is formed in the first portion 103 of the nanowire structure 101 and does not extend into the second portion 105. Therefore, the source region 115 has a length substantially equal to the first length L$_1$ of the first portion 103. In addition, the drain region 117 is formed in the fifth portion 111 of the nanowire structure 101 and does not extend into the fourth portion 109. Therefore, the drain region 117 has a length substantially equal to the fifth length L$_5$ of the fifth portion 111 in accordance with some embodiments.

Furthermore, the gate structure 113 is formed around the third portion 107 and does not extend over the second portion 105 or the fourth portion 109. Therefore, the gate structure 113 has a length substantially equal to the third length L$_3$ of the third portion 107. The lengths described above may be measured along the long side of the nanowire structure 101. For example, the length of the gate structure 113 (e.g. the third length L$_3$), the second length L$_2$, and the length of the source region 115 (e.g. the first length L$_1$) are all measured along the same direction.

In some embodiments, a ratio of the second length L$_2$ to the length of the gate structure 113 (e.g. the third length L$_3$) is greater than about 0.2. In some embodiments, a ratio of the second length L$_2$ to the length of the gate structure 113 (e.g. the third length L$_3$) is in a range from about 0.1 to about 1. In some embodiments, a ratio of the second length L$_2$ to the length of the gate structure 113 (e.g. the third length L$_3$) is in a range from about 0.3 to about 1. The second length L$_2$ of the second portion 105 of the nanowire structure 101 should be large enough so the effective gate length of the transistor in the OFF state can be greater than the physical gate length of the transistor (Details will be described later).

Similarly, a ratio of the fourth length L$_4$ to the length of the gate structure 113 (e.g. the third length L$_3$) is greater than about 0.2. In some embodiments, a ratio of the fourth length L$_4$ to the length of the gate structure 113 (e.g. the third length L$_3$) is in a range from about 0.3 to about 1. The fourth length L$_4$ of fourth portion 109 of the nanowire structure 101 should be large enough so the effective gate length of the transistor in the OFF state can be greater than the physical gate length of the transistor (Details will be described later).

As shown in FIG. 1B, the source region 115 and the drain region 117 are separated from the third portion 107 over which the gate structure 113 is formed. Therefore, there are additional spaces (i.e. second portion 105 and fourth portion 109) in the nanowire structure 101 for the depletion region to expand. That is, the depletion region in the nanowire structure 101 may not only exist in the third portion 107 under the gate structure 113 but also extends into the second portion 105 and the fourth portion 109, which are not covered by the gate structure 113. Accordingly, the depletion region may have a length greater than the physical length (e.g. the third length L$_3$) of the gate structure 113, such that the semiconductor structure 100 may have an effective gate length (i.e. effective channel length) greater than it physical gate length (e.g. the third length L$_3$).

FIGS. 2A to 2D are cross-sectional representations of semiconductor structures 100a to 100d at different stages in accordance with some embodiments. The semiconductor structure shown in FIGS. 2A to 2D may be similar to, or the same as, the semiconductor structure 100 described previously, but different voltages are applied to the semiconductor structures 100a to 100d.

Figure 2A:
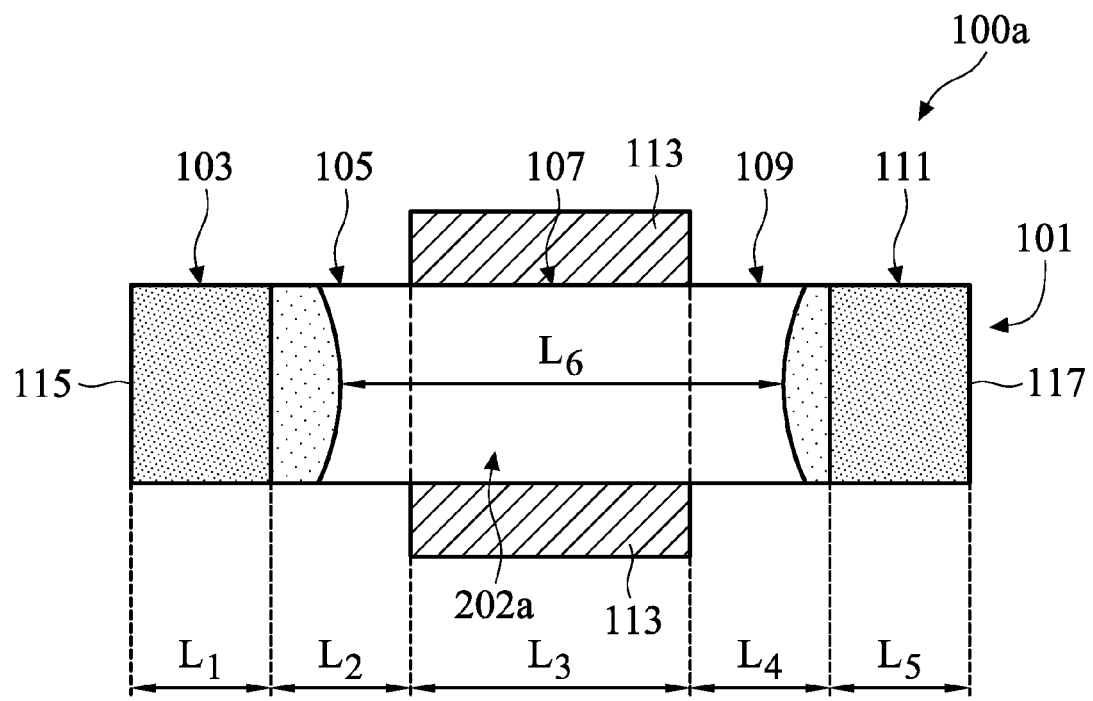
FIGS. 2A to 2D are cross-sectional representations of semiconductor structures at different stages in accordance with some embodiments.

More specifically, FIGS. 2A to 2D show possible length of the depletion region in a nanowire structure at different states of the transistor. In FIG. 2A, no voltage is applied to the gate structure 113. That is, the transistor is turned off (at its "off" state). At the "off" state (e.g. when the transistor is turned off), the nanowire structure 101 is depleted of electrons (e.g. dopants) to form a depletion region 202a, as shown in FIG. 2A in accordance with some embodiments.

As described previously, the second portion 105 is located between the source region 115 and the third portion 107 on which the gate structure 113 is formed. Accordingly, the depletion region 202a can extend into the second region 105 without contacting with the source region 115. As shown in FIG. 2A, the source region 115 and the depletion region 202a are separated by a portion of the second portion 105, such that the depletion region 202a does not extend into the source region 115, even in its "off" state.

In some embodiments, the depletion region 202a has an edge closer to the source region 115 and the source region 115 has an edge closer to the depletion region 202a, and the two edges are separated from each other. In some embodiments, the distance between the edge of the depletion region 202a and the edge of the source region 115 is greater than zero, such as greater than about 1 nanometer or more.

Similarly, the fourth portion 109 is located between the drain region 117 and the third portion 107 on which the gate structure 113 is formed. Accordingly, the depletion region 202a can extend into the fourth portion 109 without contacting with the drain region 117. As shown in FIG. 2A, the depletion region 202a does not extend into the drain region 117 even in its "off" state.

Accordingly, when a first voltage $V_1$ is applied to the gate structure 113 (e.g. the transistor is in its "off" state), the depletion region 202a has a length $L_6$, which is greater than the physical length of the gate structure 113 (e.g. the third length $L_3$). In some embodiments, a ratio of the length $L_6$ to the length $L_3$ is greater than about 1.05. In some embodiments, a ratio of the length $L_6$ to the length $L_3$ is in a range from about 1.1 to about 2. In some embodiments, the first voltage $V_1$ is equal to 0V.

In addition, the portion of the depletion region 202a extending in the fourth portion 109 adjacent to the drain region 117 has a length greater than the portion of the depletion region 202 extending in the second portion 105 adjacent to the source region 115 in accordance with some embodiments. In some embodiments, the fourth length $L_4$ of the fourth portion 109 is greater than the second length $L_2$ of the second portion 105.

Figure 2B:
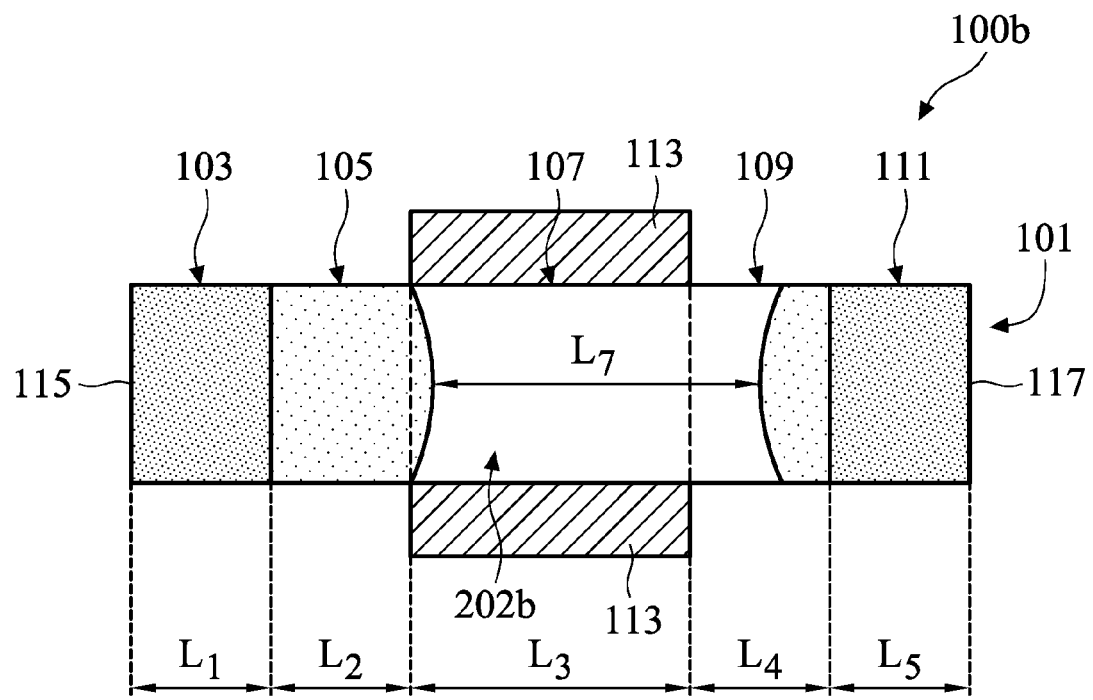

In FIG. 2B, a second voltage $V_2$ is applied to the gate structure 113 in accordance with some embodiments. As shown in FIG. 2B, the size of the depletion region shrinks as the second voltage $V_2$ is applied. More specifically, when the voltage is applied to the gate structure 113 from $V_1$ to $V_2$, the size of the depletion region 202a shrinks to form a smaller depletion region 202b.

In some embodiments, the depletion region 202b has a length $L_7$ when the second voltage $V_2$ is applied to the gate structure 113. As shown in FIG. 2B, although the length $L_7$ is smaller than the length $L_6$ shown in FIG. 2A, the length $L_7$ of the depletion region 202b is still greater than the physical length of the gate structure 113 when the second voltage $V_2$ is applied to the gate structure 113. In some embodiments, the second voltage $V_2$ is greater than about 0.4V.

As described previously, the size of the depletion region 202b near the source region 115 and that near the drain region 117 may be different. As shown in FIG. 2B, the depletion region 202b does not extend to the second portion 105 near the source region 115 but still extends into the fourth region 109 near the drain region 117.

Figure 2C:
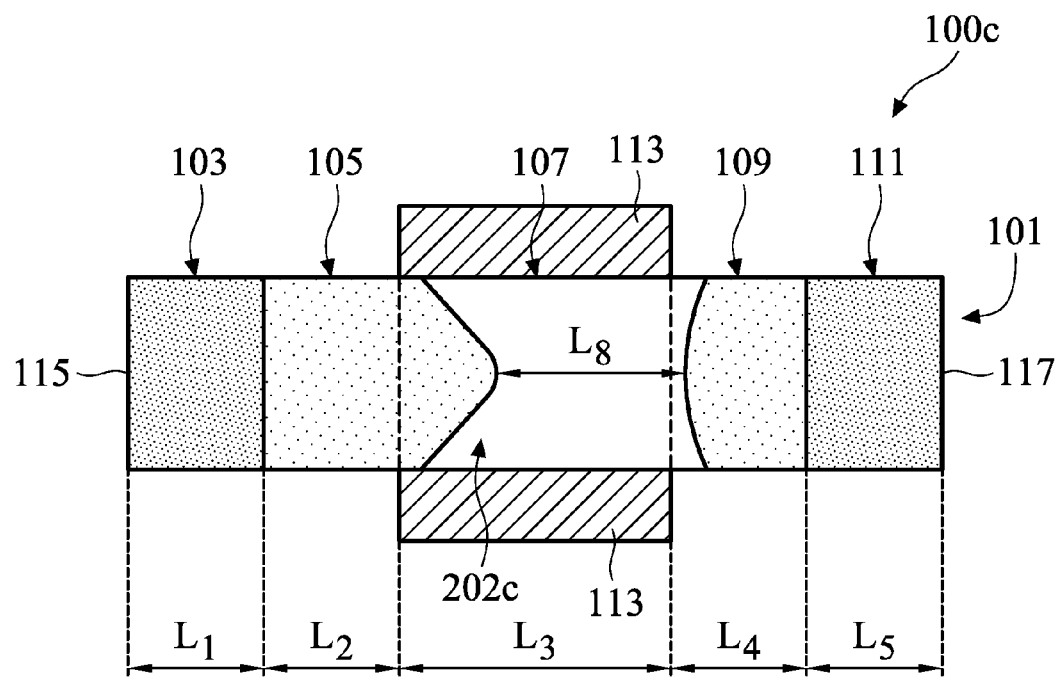

In FIG. 2C, a third voltage $V_3$, which is greater than the second voltage $V_2$, is applied to the gate structure 113 in accordance with some embodiments. When the voltage applied to the gate structure 113 is increased from the second voltage $V_3$ to the third voltage $V_3$, the depletion region 202b shrinks to form a smaller depletion region 202c.

In some embodiments, the depletion region 202c has a length $L_8$ when the third voltage $V_3$ is applied to the gate structure 113. As shown in FIG. 2C, the length $L_8$ of the depletion region 202c is smaller than the physical length of the gate structure 113 when the third voltage $V_3$ is applied. In some embodiments, the third voltage $V_3$ is greater than about 0.5V. Furthermore, as shown in FIG. 2C, when the third voltage $V_3$ is applied to the gate structure 113, only a portion of the third portion 107 is depleted of electrons.

Figure 2D:
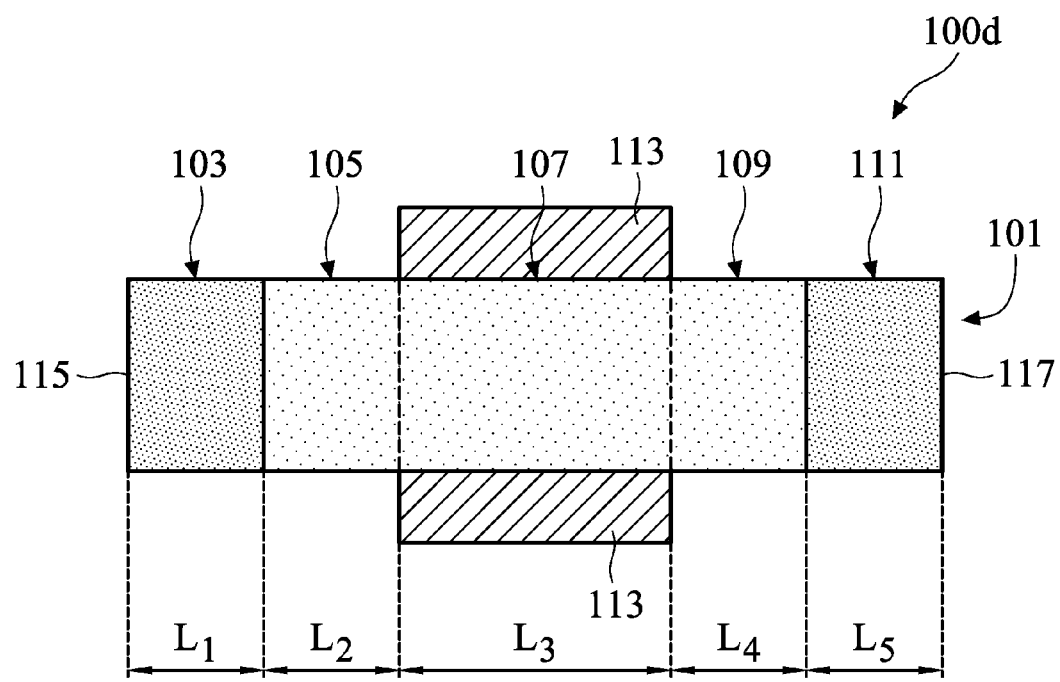

In FIG. 2D, a fourth voltage $V_4$, which is greater than the third voltage $V_3$, is applied to the gate structure 113 in accordance with some embodiments. As shown in FIG. 2D, there may be no depletion region in the nanowire structure 101 when the fourth voltage $V_4$ is applied to the gate structure 113. That is, carriers may be able to transport between the source region 115 and the drain region 117 through the second portion 105, the third portion 107, and the fourth portion 119 of the nanowire structure 101, and the transistor is turned on (e.g. in its "on" state).

As shown in FIGS. 2A to 2D, additional spaces (e.g. the second portion 105 and the fourth portion 109) are left near the source region 115 and the drain region 117. Therefore, the depletion region, such as depletion region 202a, can extend into the additional spaces without touching the source region 115 and the drain region 117. In some embodiments, the depletion region change its size (as shown in FIGS. 2A to 2D) as different amount of voltages is applied to the transistor, but the depletion region is not in contact with the source region 115 and the drain region 117 are all time and at all state (including "on" state and "off" state).

In addition, when the voltage applied to the gate structure 113 changes, the size of the depletion region can not only change but even enlarge. Therefore, the effective gate length (i.e. effective channel length) of the transistor can be greater than the physical length of the gate structure 113. In some embodiments, the difference of the length between the effective gate length and the physical gate length should be large enough to have a meaningful gate length change. By having the gate length change being large enough, the transistor can have a subthreshold slope close to 60 mV/decade, for example. Accordingly, the performance of the transistor may be improved.

It should be noted that, although no depletion region is shown in FIG. 2D, there may still be a small region of depletion region in the nanowire structure in its "on" state in some other embodiments.

In addition, the size of the depletion region in a nanowire structure may be different depending on its dopant type, dopant concentration, the material used to form the nanowire structure, and/or the physical length of the gate structure. However, as long as the additional spaces between the source region (and/or the drain region) and the portion on which the gate structure is formed is large enough for the depletion region to enlarge its size, the performance of the transistor can be improved.

The depletion regions, such as depletion regions 202 and 202a to 202d, described above may be defined as a region in a nanowire structure where the mobile charge carriers are diffused away. Therefore, the electron concentration at the depletion region will be smaller than the dopant concentration as it has been doped originally.

FIGS. 3A to 3E show possible dopant concentrations in each portion of some nanowire structures in accordance with some embodiments. The nanowire structures shown in FIGS. 3A to 3E may be similar to, or the same as, the nanowire structure 101 described previously. For example, the nanowire structure may also have the first portion 103, the second portion 105, the third portion 107, the fourth portion 109, and the fifth portion 111. In addition, the source region 115 is formed in the first portion 103, and the drain region 117 is formed in the fifth portion 111. The source region 115 (e.g. the first portion 103), the second portion 105, the third portion 107, the fourth portion 109, and the drain region 117 (e.g. the fifth portion 111) are doped with the same type of dopants but the dopant concentration implanted in each portion may be different, as shown in FIGS. 3A to 3E.

Figure 3A:
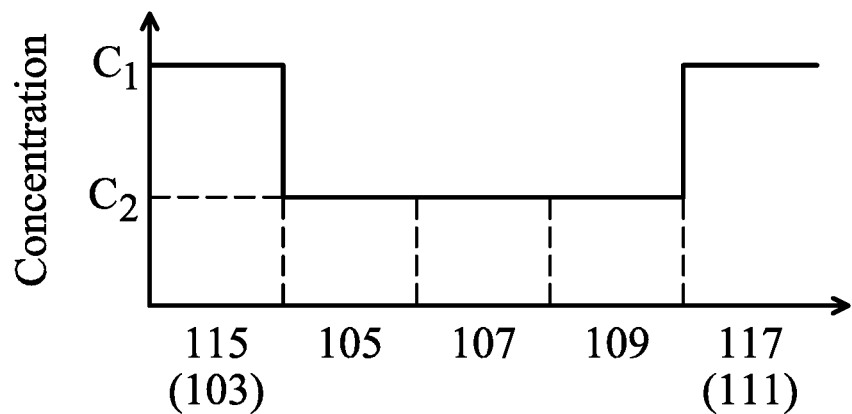
FIGS. 3A to 3E show possible dopant concentrations in each portion of the nanowire structure in accordance with some embodiments.

As shown in FIG. 3A, the source region 115 (i.e. the first portion 103) and the drain region 117 (i.e. the fifth portion 111) are doped with substantially the same dopant concentration $C_1$, which is relatively high, in accordance with some embodiments. In addition, the second portion 105, the third portion 107, and the fourth portion 109 are doped with substantially the same dopant concentration $C_2$, which is smaller than the dopant concentration $C_1$ doped in the source region 115 and the drain region 117.

In some embodiments, the dopant concentration $C_1$ is in a range from about 1e20 to about 5e21. In some embodiments, the dopant concentration $C_2$ is in a range from about 1e19 to about 6e19.

Figure 3B:
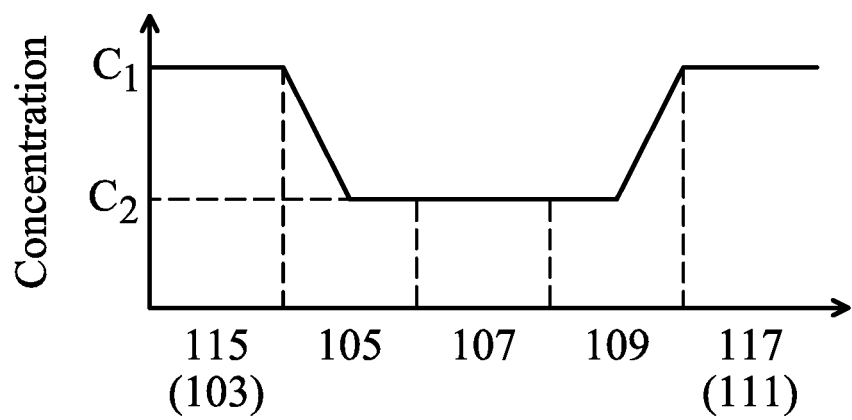

FIG. 3B shows another possible way to dope a nanowire structure in accordance with some embodiments. Similar to FIG. 3A, the source region 115 (i.e. the first portion 103) and the drain region 117 (i.e. the fifth portion 111) are doped with a relatively high dopant concentration $C_1$ in accordance with some embodiments. In addition, the third portion 107 is doped with a dopant concentration $C_2$ which is smaller than the dopant concentration $C_1$ doped in the source region 115 and the drain region 117. In addition, in the second portion 105 and the fourth portion 109, the dopants are doped in a gradient concentration, such that the dopant concentration in the second portion 105 and the fourth portion 109 are gradually decreased from the dopant concentration $C_1$ in the source region 115 and the drain region 117 to the dopant concentration $C_2$ in the third portion 107.

Figure 3C:
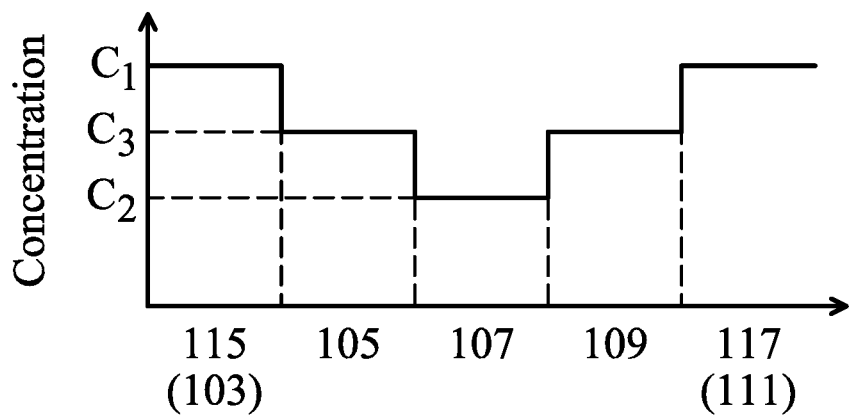

FIG. 3C shows another possible way to dope a nanowire structure in accordance with some embodiments. Similar to those described above, the source region 115 (i.e. the first portion 103) and the drain region 117 (i.e. the fifth portion 111) are doped with a relatively high dopant concentration $C_1$ in accordance with some embodiments.

In addition, the third portion 107 is doped with a dopant concentration $C_2$ which is smaller than the dopant concentration doped in the source region 115 and the drain region 117. Furthermore, the second portion 105 and the fourth portion 109 are doped with a dopant concentration $C_2$ lower than the dopant concentration $C_1$ doped in the source region 115 and the drain region 117 but higher than the dopant concentration $C_2$ doped in the third portion 107.

Figure 3D:
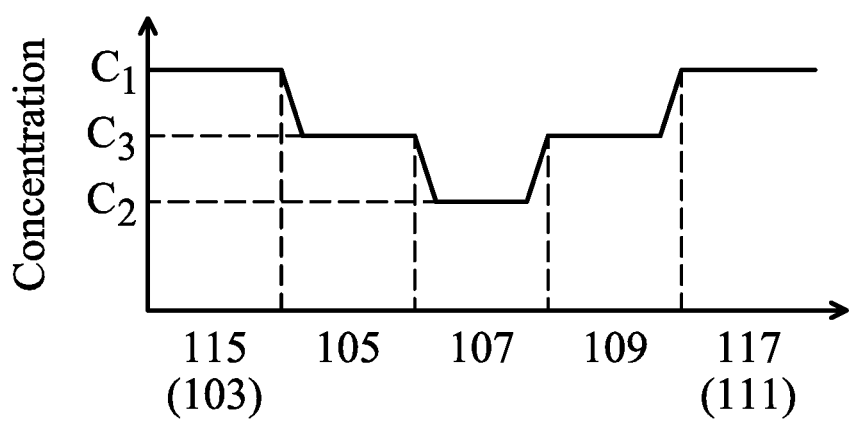

FIG. 3D shows another possible way to dope a nanowire structure in accordance with some embodiments. The dopant concentration shown in FIG. 3D is similar to that shown in FIG. 3C, except gradient dopant concentrations are shown between each portion of the nanowire structure 101.

Figure 3E:
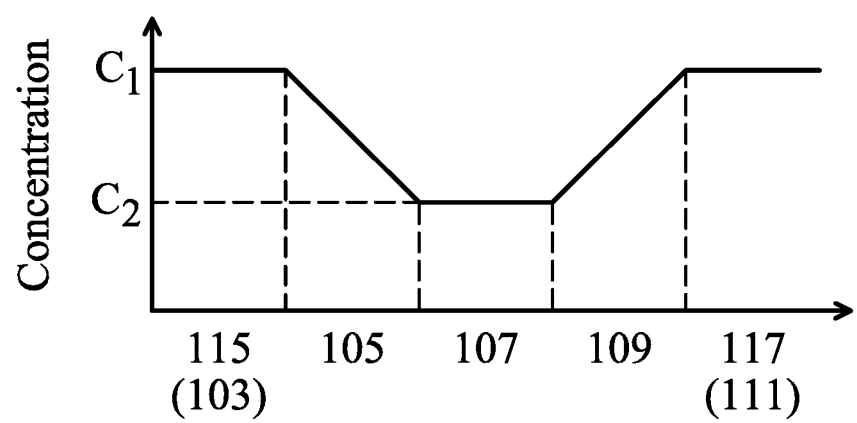

FIG. 3E shows another possible way to dope a nanowire structure in accordance with some embodiments. The dopant concentration shown in FIG. 3E is similar to that shown in FIG. 3B. However, the second portion 105 is doped in a way that the concentration in the second portion 105 continuously decreases from the edge adjacent to the source region 115 to the edge adjacent to the third portion 107. Similarly, the fourth portion 109 is doped in a way that the concentration in the fourth portion 109 continuously decreases from the edge adjacent to the drain region 117 to the edge adjacent to the third portion 107.

The semiconductor structure described previously may be formed by various manufacturing processes to have the additional spaces so the effective channel length can be enlarged. FIGS. 4A to 4H are cross-sectional representations of various stages of forming a semiconductor structure 200 in accordance with some embodiments.

Figure 4A:
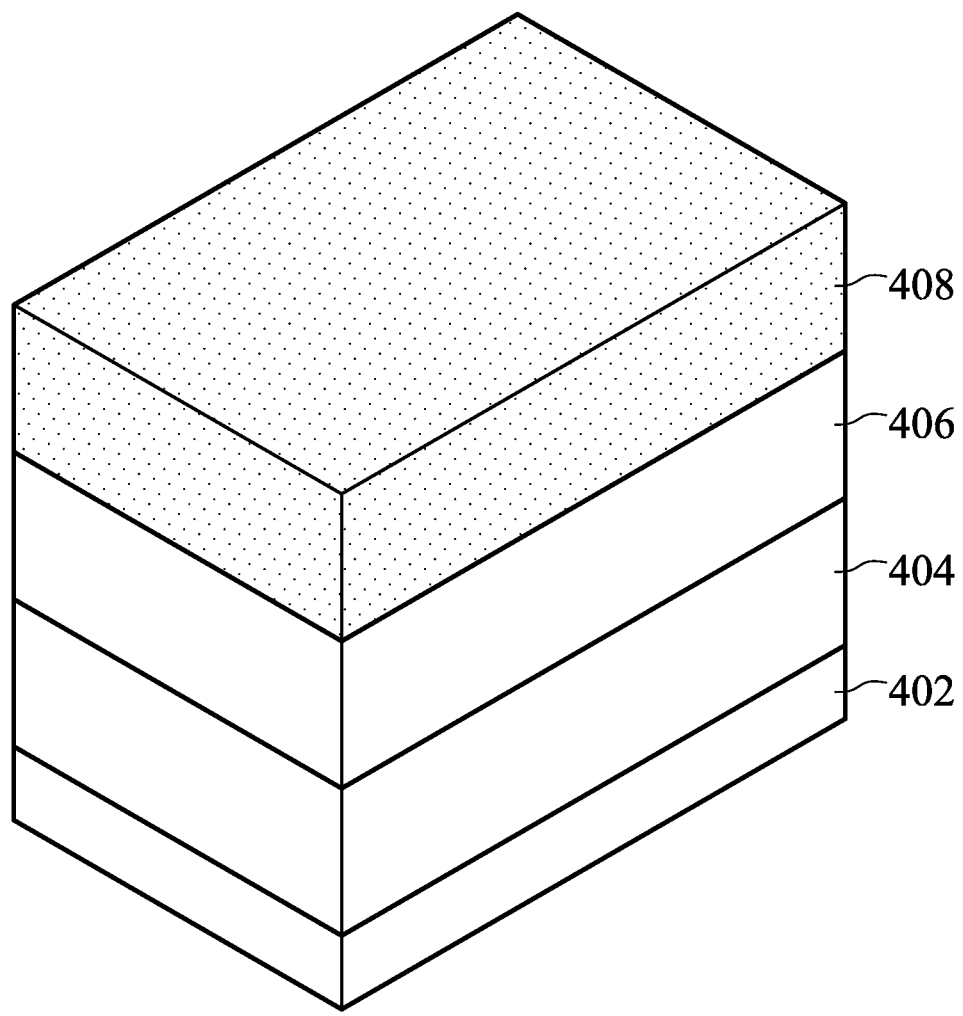
FIGS. 4A to 4H are cross-sectional representations of various stages of forming a semiconductor structure 200 in accordance with some embodiments.

As shown in FIG. 4A, a substrate 402 is provided in accordance with some embodiments. In some embodiments, the substrate 402 is a silicon substrate. In some embodiments, the substrate 402 is a silicon-on-insulator (SOI) substrate.

An oxide layer 404, a sacrificial layer 406, a semiconductor layer 408 are formed over the substrate 102, as shown in FIG. 4A in accordance with some embodiments. In some embodiments, the oxide layer 404 is made of silicon oxide, silicon dioxide, or the like. In some embodiments, the sacrificial layer 406 is made of SiGe, InP, or the like. In some embodiments, the semiconductor layer 408 is made of Si, SiGe, Ge, SiC, InGaAs, or the like. In some embodiments, the sacrificial layer 406 and the semiconductor layer 408 are both made of semiconductor materials but are made of different semiconductor materials. In some embodiments, the semiconductor layer 408 is doped with N-type dopants or P-type dopants.

Figure 4B:
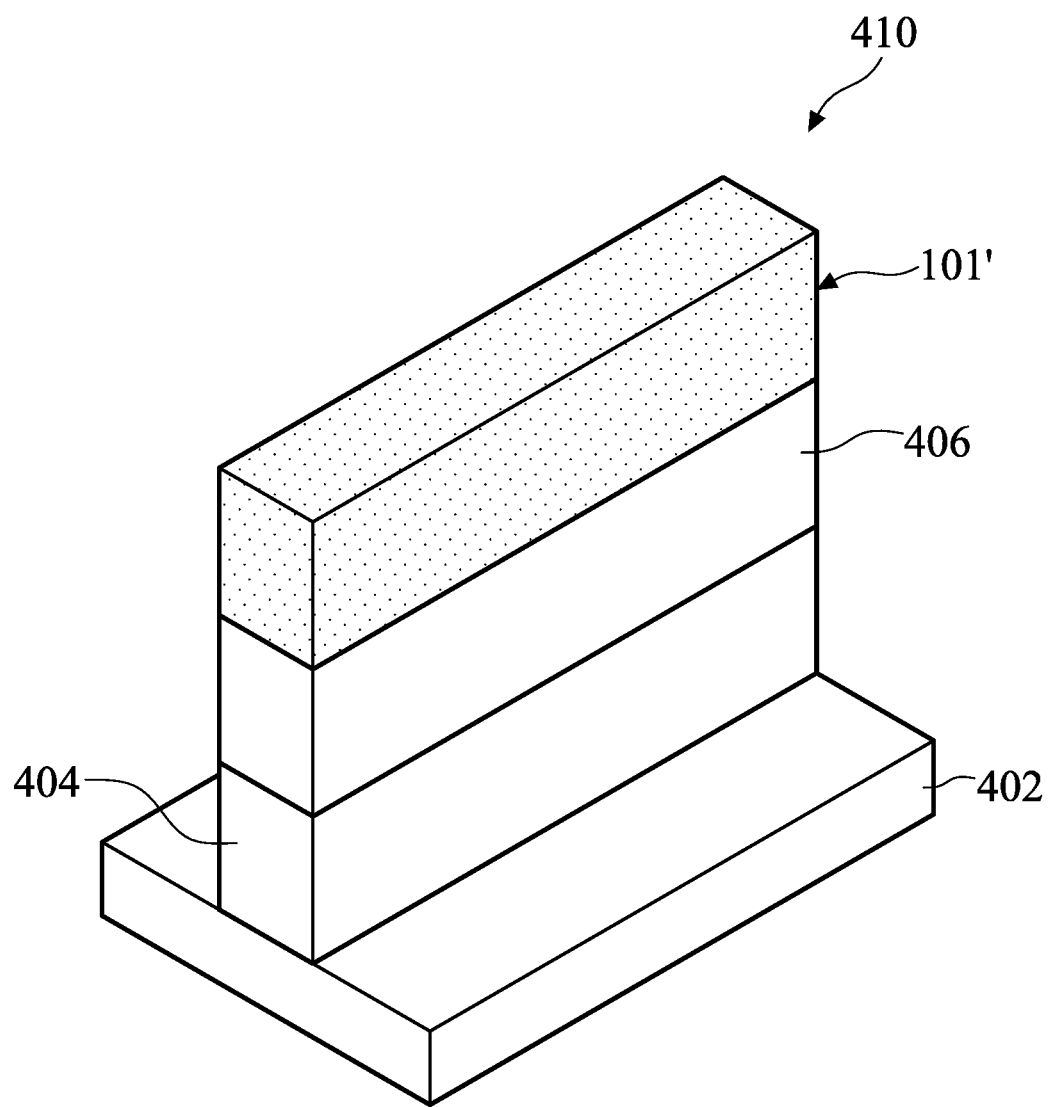

Afterwards, a fin structure 410 is formed, as shown in FIG. 4B in accordance with some embodiments. The fin structure 410 may be formed by patterning the semiconductor layer 408, the sacrificial layer 406, and the oxide layer 404. The fin structure 410 may include a nanowire structure 101', which is similar to the nanowire structure 101 described previously.

Figure 4C:
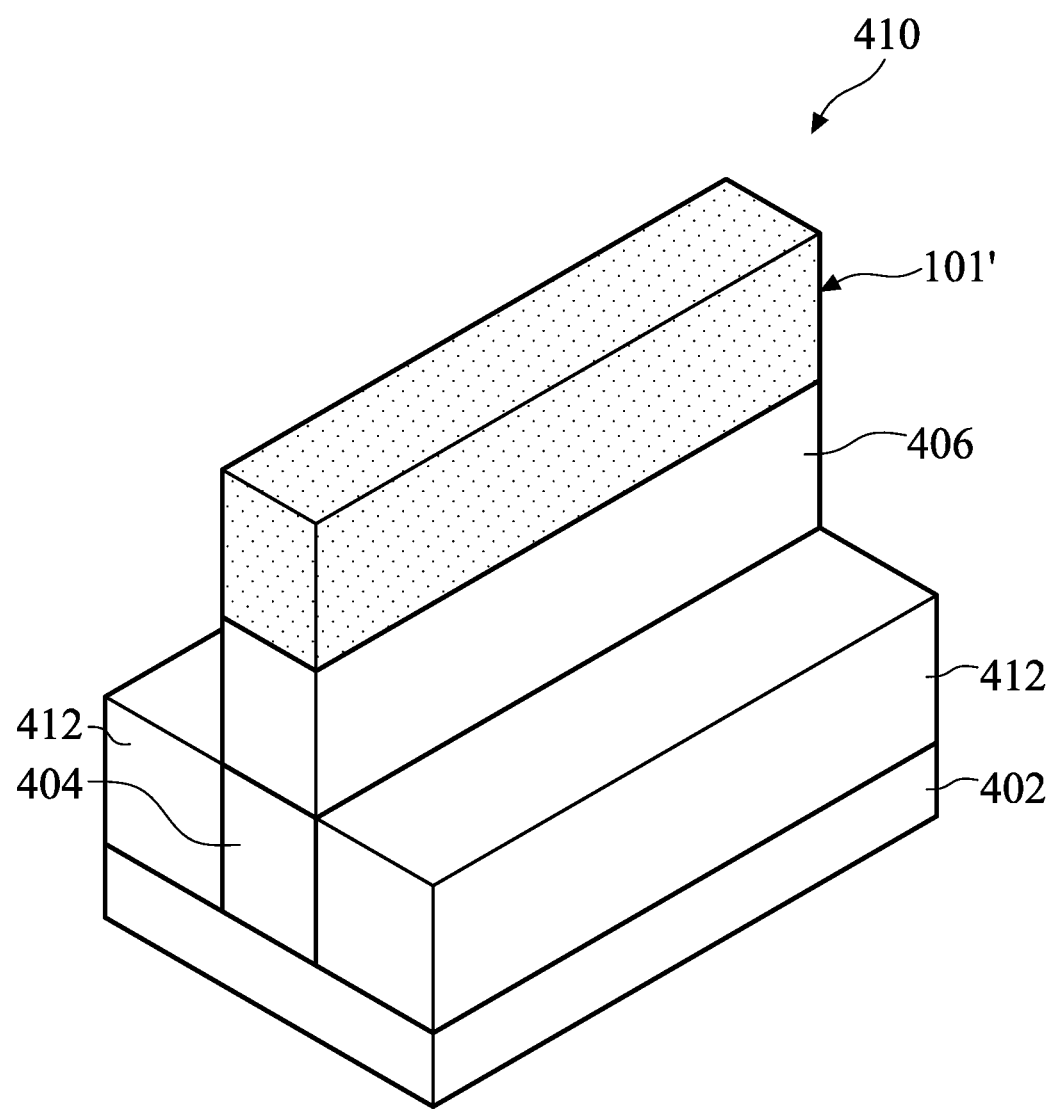

After the fin structure 410 is formed, a shallow trench isolation (STI) structure 412 is formed over the substrate 402, as shown in FIG. 4C in accordance with some embodiments. The shallow trench isolation structure 412 may be formed around the fin structure 410. In some embodiments, the shallow trench isolation structure 412 is made of silicon oxide.

Figure 4D:
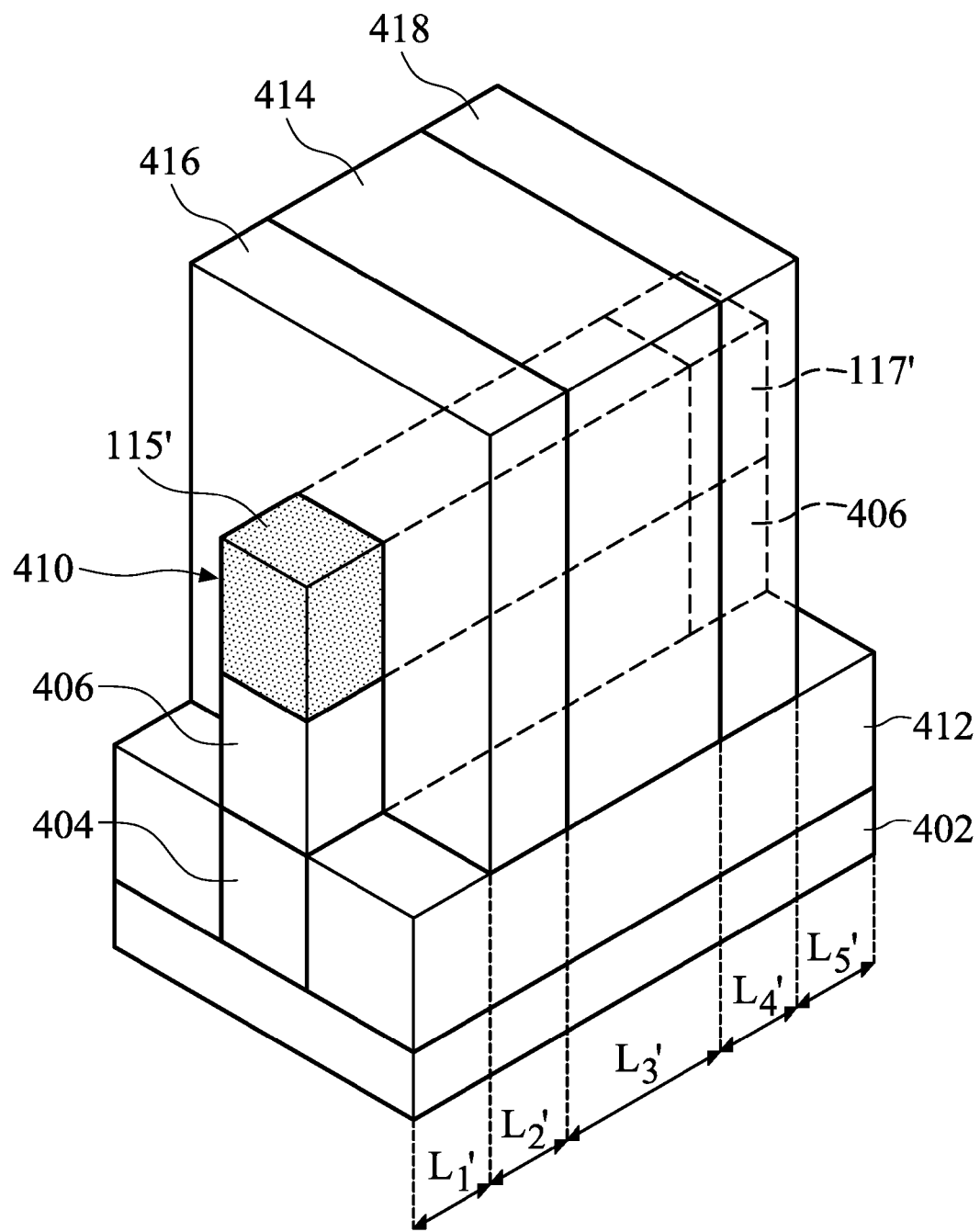

After the shallow trench isolation structure 412 is formed, a dummy gate structure 414 is formed across the fin structures 410 over the substrate 402, as shown in FIG. 4D in accordance with some embodiments. In some embodiments, the dummy gate structure 414 is made of polysilicon.

A first spacer 416 and a second spacer 418 are formed on the sidewalls of the dummy gate structure 414 in accordance with some embodiments. In some embodiments, the first spacer 416 and the second spacer 418 are made of silicon nitride, silicon oxide, silicon oxynitride, silicon carbide, or other applicable dielectric materials.

A source region 115' and a drain region 117' are formed on two ends of the nanowire structure 101', as shown in FIG. 4D in accordance with some embodiments. The source region 115' may be similar, or the same as, to the source region 115 described previously, and the drain region 117' may be similar to, or the same as, the drain region 117 described previously. For example, the source region 115' and the drain region 117' are doped with the same type of dopants which are doped in the nanowire structure 101', but the dopant concentrations in the source region 115' and the drain region 117' are higher than that originally doped in the nanowire structure 101'.

As shown in FIG. 4D, the source region 115' has a first length $L_1'$, which may be the same as the first length $L_1$ described previously. The first spacer 416 formed close to the source region 115' has a second length $L_2'$, which may be the same as the second length $L_2$ described previously. The dummy gate structure 414 has a third length $L_3'$, which may be the same as the third length $L_3$ described previously. The second spacer 418 formed close to the drain region 117' has a fourth length $L_4'$, which may be the same as the fourth length $L_4$ described previously. The drain region 117' has a fifth length $L_5'$, which may be the same as the fifth length $L_5$ described previously. The second length $L_2'$ and the fourth length $L_4'$ are relatively large, such as greater than 0.5 times of the third length $L_3'$ of the gate structure 113', so that additional spaces are provided for the depletion region to extend therein.

Figure 4E:
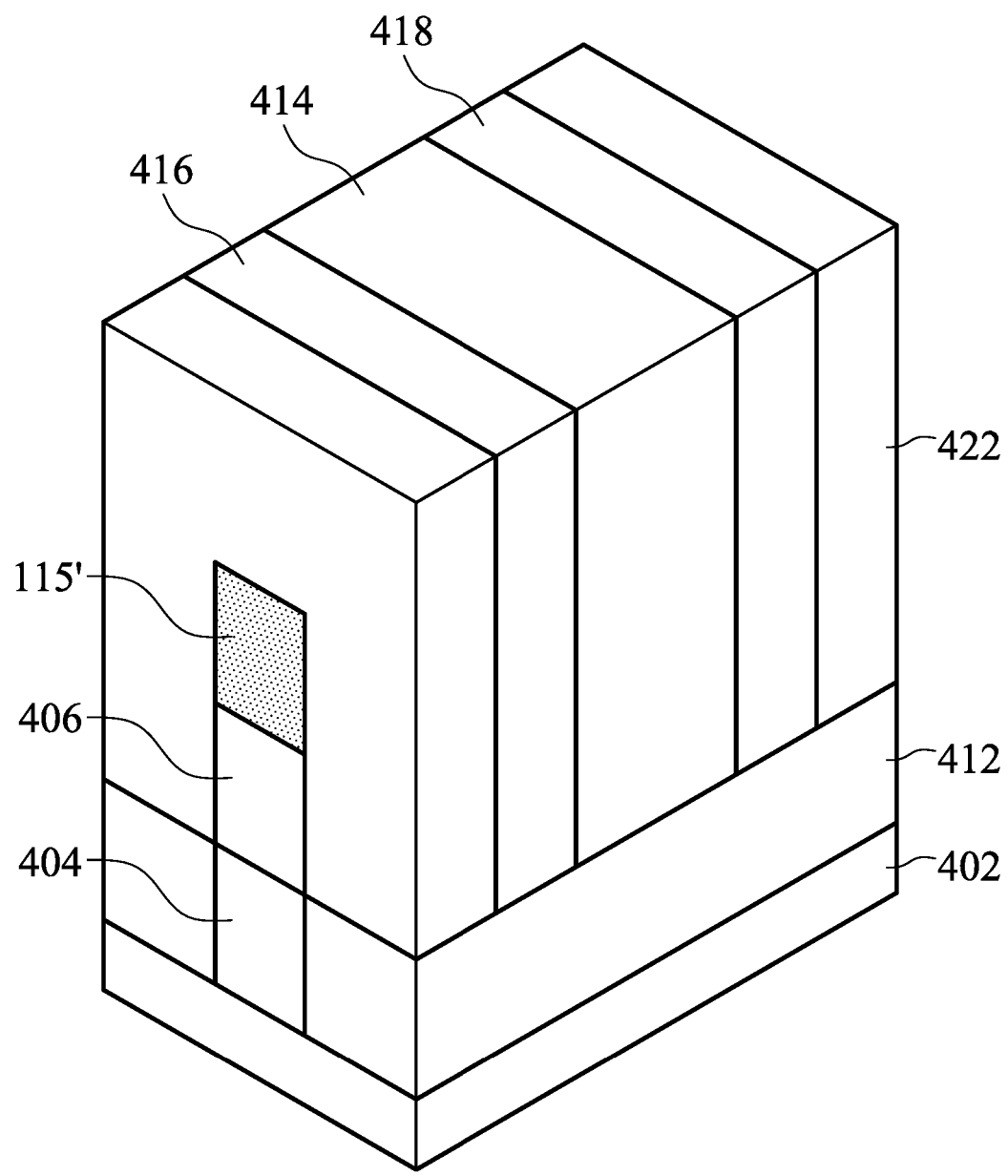

After the source region 115' and the drain region 117' are formed, a material layer 422 is formed, as shown in FIG. 4E in accordance with some embodiments. In some embodiments, the material layer 422 is epitaxial growth of Si or SiGe or Ge, which is used to grow source and drain contact regions. In some embodiments, SiP epitaxy is used for n-channel transistors, and SiGeB is used for p-channel transistors.

Next, a polishing process is performed on the material layer 422 to expose the top surface of the dummy gate structure 414, as shown in FIG. 4E in accordance with some embodiments. In some embodiments, the imaterial layer 422 is planarized by a chemical mechanical polishing (CMP) process until the top surfaces of the dummy gate structure 414 is exposed.

Figure 4F:
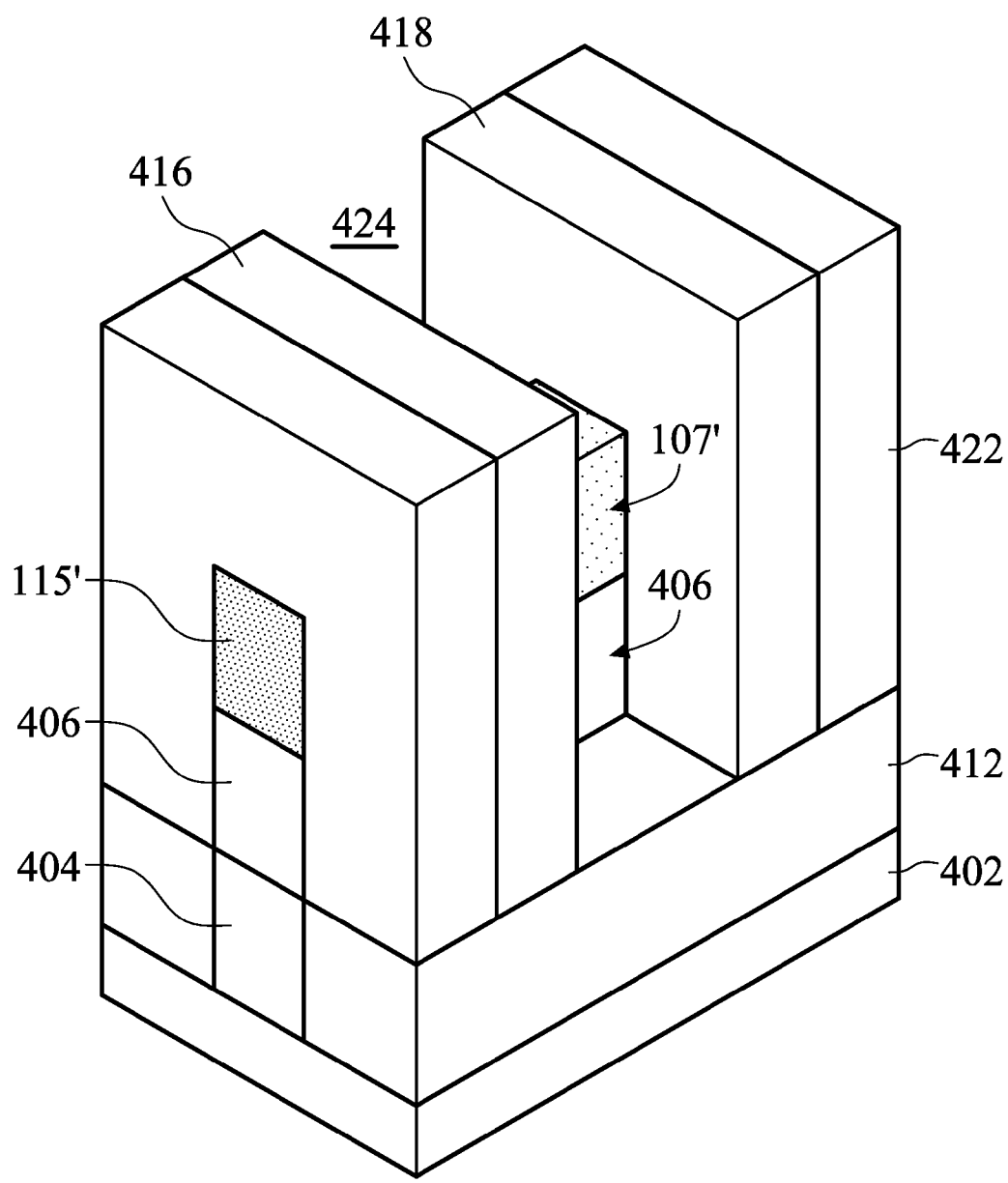

After the polishing process is performed, the dummy gate structure 414 is removed to form a trench 424, as shown in FIG. 4F in accordance with some embodiments. As shown in FIG. 4F, a portion 107' of the nanowire structure 101' and a portion of the sacrificial layer 406 are exposed in the trench 424 after the dummy gate structure 414 is removed. The portion 107' of the nanowire structure 101' may be similar to, or the same as, the third portion 107 described previously.

Figure 4G:
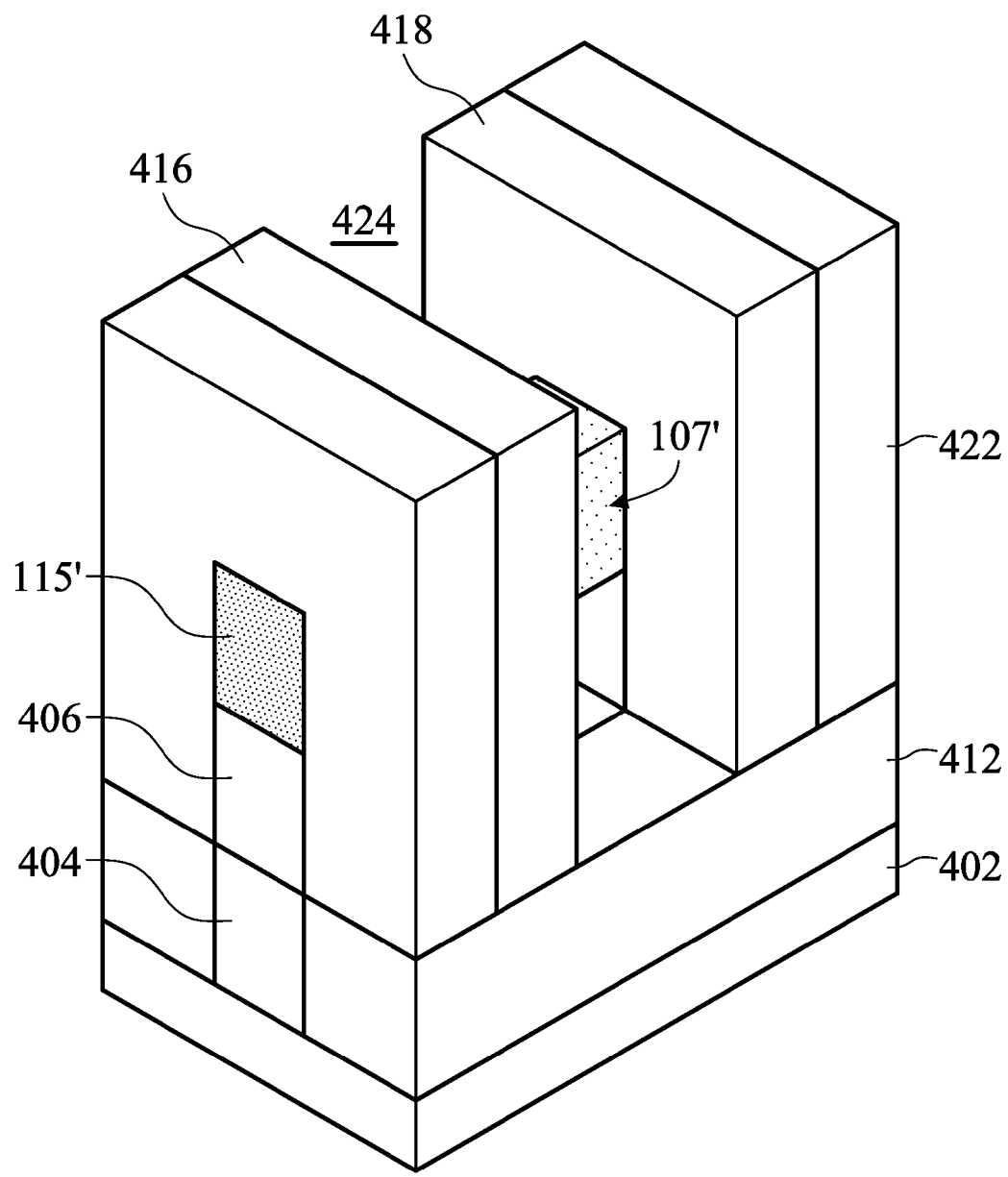

Next, the portion of the sacrificial layer 406 exposed in the trench 424 is removed, as shown in FIG. 4G in accordance with some embodiments. In some embodiments, the portion of the sacrificial layer 406 is removed by a wet etching process.

Figure 4H:
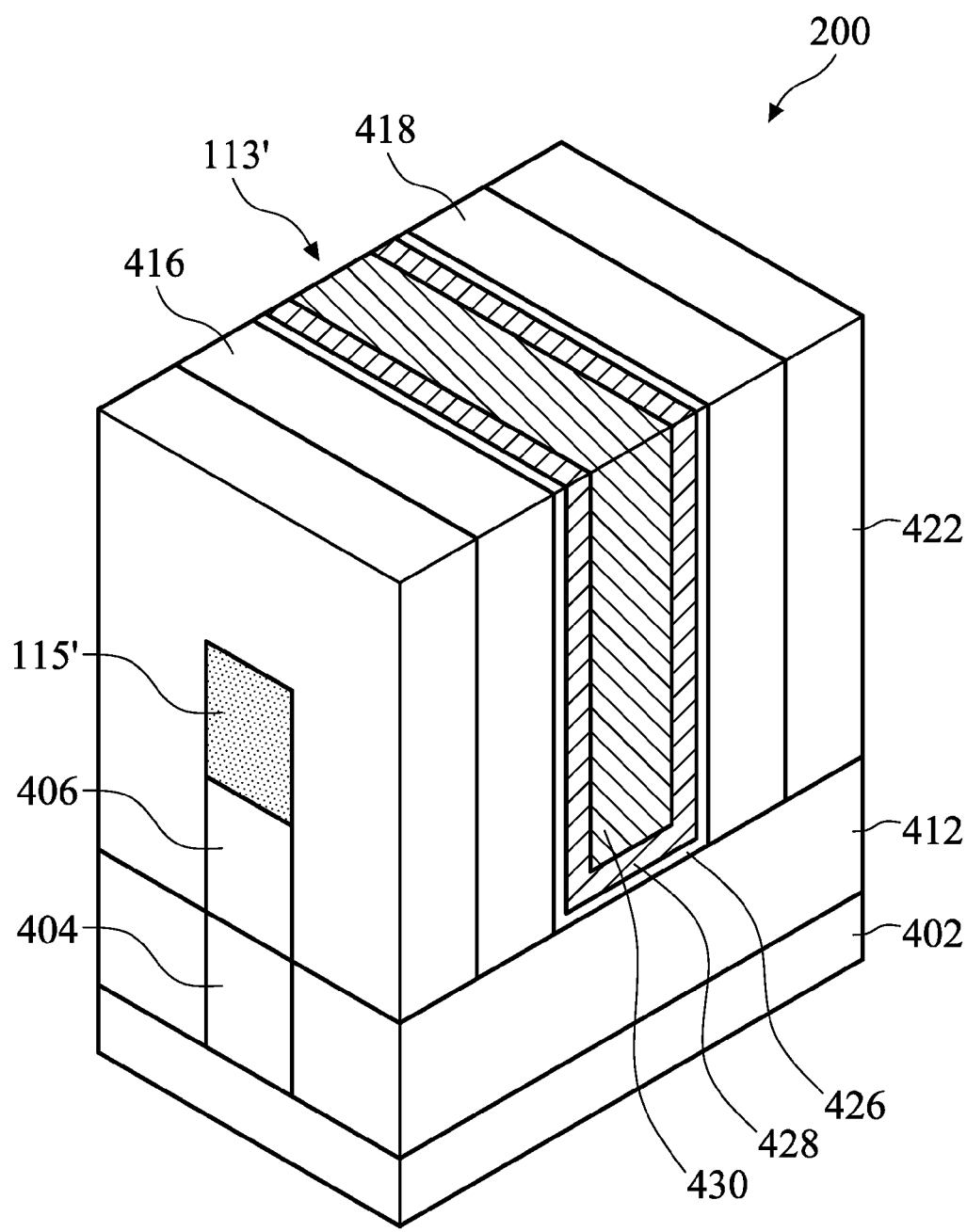

After the sacrificial layer 406 is removed, a metal gate structure 113' is formed in the trench 424, as shown in FIG. 4H in accordance with some embodiments. The metal gate structure 113' may be similar to, or the same as, the gate structure 113 described previously. In some embodiments, the metal gate structure 113' is formed around the portion 107' of the nanowire structure 101'.

In some embodiments, the metal gate structure 113' includes a gate dielectric layer 426, a work function metal layer 428, and a metal gate electrode layer 430. In some embodiments, the gate dielectric layer 426 is made of metal oxides, metal nitrides, metal silicates, transition metal oxides, transition metal nitrides, transition metal silicates, oxynitrides of metals, metal aluminates, or other high-k dielectric materials. Examples of the high-k dielectric material may include, but are not limited to, hafnium oxide ($HfO_2$), hafnium silicon oxide ($HfSiO_2$), hafnium silicon oxynitride (HfSiON), hafnium tantalum oxide ($HfTaO_2$), hafnium titanium oxide ($HfTiO_2$), hafnium zirconium oxide ($HfZrO_2$), zirconium silicate, zirconium aluminate, zirconium oxide, titanium oxide, aluminum oxide, or hafnium dioxide-alumina ($HfO_2$—$Al_2O_3$) alloy.

The work function metal layer 428 is formed over the gate dielectric layer 426 in accordance with some embodiments. The work function metal layer 428 may be customized to have the proper work function. For example, if P-type work function metal (P-metal) for a PMOS device is desired, Pt, Ta, Re, N+-polysilicon, TiN, WN, or W may be used. On the other hand, if an N-type work function metal (N-metal) for NMOS devices is desired, Al, P+ polysilicon, Ti, V, Cr, Mn, TiAl, TiAlN, TaN, TaSiN or TaCN, may be used.

The metal gate electrode layer 430 is formed over the work function metal layer 428 in accordance with some embodiments. In some embodiments, the metal gate electrode layer 430 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. The gate dielectric layer 426, the work function metal layer 428, and the metal gate electrode layer 430 may be formed by any applicable process to any applicable thickness.

It should be noted that additional layers may be formed above and/or below the gate dielectric layer 426, the work function metal layer 428, and the metal gate electrode layer 430, such as liner layers, interface layers, seed layers, adhesion layers, barrier layers, or the like. In addition, the gate dielectric layer 426, the work function metal layer 428, and the metal gate electrode layer 430 may include one or more materials and/or one or more layers.

In some embodiments, the semiconductor structure 200 is a nanowire transistor. In some embodiments, the semiconductor structure 200 is a junctionless nanowire transistor. As described previously, the first spacer 416 and the second spacer 418 are relatively thick, so the portions under the first spacer 416 and the second spacer 418 can be used as additional spaces (e.g. the second portion 105 and the fourth portion 109 shown in FIG. 1B). Accordingly, a depletion region (e.g. the depletion regions 202a as shown in FIG. 2A) in the nanowire structure 101' in the semiconductor structure 200 can extend into the additional spaces to have an effective gate length greater than the physical gate length of the gate structure 113'. The details of the semiconductor structure 200, such as the depletion region, the effective gate length, and the dopant concentration, are similar to, or the same as, those described in FIGS. 1A to 3E and are not repeated herein.

Generally, a gate structure in a transistor may not be too small due to the short channel effect. However, in some embodiments of the disclosure, a transistor can have a changeable gate length, as shown in FIGS. 2A to 2D, and the effective gate length can be larger than the physical gate length of the gate structure (e.g. gate structure 113). Therefore, a transistor having a relative small physical gate length can still have good performance.

More specifically, in some embodiments of the disclosure, a junctionless nanowire structure (e.g. the nanowire structure 101) is formed with additional spaces (e.g. the second portion 105 and the fourth portion 109) near the source/drain regions (e.g. the source region 115 and the drain region 117). At the "off" state of the transistor, the depletion region (e.g. the depletion region 202a) can extend into the additional spaces, so the effective gate length (e.g. effective channel length) can be greater than the physical length of the gate structure (e.g. the gate structure 113).

The length of the depletion region, at the "off" state of the transistor, may be different depending on the dopant type, dopant concentration, the material of the nanowire structure, and the length of the gate structure. However, the difference of the length between the effective gate length and the physical gate length should be large enough to have a meaningful gate length change. By having the gate length change being large enough, the transistor can have a sub-threshold slope close to 60 mV/decade, for example. In some embodiments, the depletion region does not contact with the source/drain regions at all times and at all stages (e.g. both "on" state and "off" state), so the difference of the length between the effective gate length and the physical gate length can be large enough.

Furthermore, since the effective gate length of the transistor is greater than the physical gate length, the transistor can have a higher current ratio between its "on" state and "off" state. In some embodiments, the ratio of $I_{on}$ to $T_{off}$ is in a range from about 1e5 to about 1e8. Accordingly, the nanowire structure with additional spaces described above may be used in an ultra-low power operation while still having a great performance.

Embodiments of a semiconductor structure and methods for forming the same are provided. The semiconductor structure includes a nanowire structure, a gate structure formed around a portion the nanowire structure, and a source region formed at one end of the nanowire structure. In addition, an addition space is left between the source region and the portion on which the gate structure is formed. Therefore, the depletion region in the nanowire structure can extend into the additional space, so that the effective gate length of the semiconductor structure can be greater than the physical gate length. Accordingly, the performance of the semiconductor structure can be improved.

In some embodiments, a semiconductor structure is provided. The semiconductor structure includes a substrate and a nanowire structure formed over the substrate. In addition, the nanowire structure includes a first portion, a second portion, and a third portion. The semiconductor structure further includes a gate structure formed around the third portion of the nanowire structure and a source region formed in the first portion of the nanowire structure. In addition, a depletion region in the nanowire structure has a length longer than a length of the gate structure and is not in contact with the source region.

In some embodiments, a semiconductor structure is provided. The semiconductor structure includes a substrate and a nanowire structure formed over the substrate. In addition, the nanowire structure includes a first portion, a second portion, a third portion, a fourth portion, and a fifth portion. The semiconductor structure further includes a gate structure formed around the third portion of the nanowire structure and a source region formed in the first portion of the nanowire structure. The semiconductor structure further includes a drain region formed in the fifth portion of the nanowire structure. In addition, a depletion region extends in the second portion, the third portion, and the fourth portion of the nanowire structure, such that a length of the depletion region is greater than a length of the gate structure, and the depletion region under the gate structure does not contact with the source region and the drain region in a "off" state of the semiconductor structure.

In some embodiments, a method for manufacturing a semiconductor structure is provided. The method for manufacturing a semiconductor structure includes forming a nanowire structure over a substrate and forming a gate structure around a portion of the nanowire structure. The method for manufacturing a semiconductor structure further includes forming a spacer on a sidewall of the gate structure and forming a source region in a portion of the nanowire structure adjacent to the spacer. In addition, a depletion region in the nanowire structure extends into a portion under the spacer when the transistor structure is at its "off" state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a nanowire structure formed over the substrate, wherein the nanowire structure comprises a first portion, a second portion, and a third portion, and the second portion is located between the first portion and the third portion;
   a gate structure formed around the third portion of the nanowire structure;
   a source region having a first dopant concentration formed in the first portion of the nanowire structure,
   wherein a depletion region in the nanowire structure has a length longer than a length of the gate structure and is not in contact with the source region having the first dopant concentration, and wherein the first portion, the second portion, and the third portion are doped with a same type of dopants, and the first dopant concentration of the source region is greater than a second dopant concentration in the second portion.

2. The semiconductor structure as claimed in claim 1, wherein the depletion region extends in the third portion and the second portion of the nanowire structure but not in the first portion of the nanowire structure.

3. The semiconductor structure as claimed in claim 1, wherein a ratio of the length of the depletion region to the length of the gate structure is greater than about 1.05.

4. The semiconductor structure as claimed in claim 1, wherein dopant concentrations in the second portion and the third portion of the nanowire structure are substantially the same.

5. The semiconductor structure as claimed in claim 1, wherein the first portion and the third portion are separated by the second portion of the nanowire structure, and the second portion has a length no smaller than about 0.5 times of a length of the gate structure.

6. The semiconductor structure as claimed in claim 1, wherein the second portion is configured to be long enough for the depletion region to extend into the second portion to have the length greater than the length of the gate structure without contacting with the source region.

7. The semiconductor structure as claimed in claim 1, wherein a ratio of the length of the depletion region at an OFF state to the length of the gate structure is greater than about 1.05.

8. The semiconductor structure as claimed in claim 1, wherein the second dopant concentration in the second portion is greater than a dopant concentration in the third portion.

9. A semiconductor structure, comprising:
   a substrate;
   a nanowire structure formed over the substrate, wherein the nanowire structure comprises a first portion, a second portion, a third portion, a fourth portion, and a fifth portion, and the second portion is located between the first portion and the third portion;
   a gate structure formed around the third portion of the nanowire structure;
   a source region formed in the first portion of the nanowire structure; and
   a drain region formed in the fifth portion of the nanowire structure,
   wherein a depletion region extends in the second portion, the third portion, and the fourth portion of the nanowire structure, and a length of the second portion of the nanowire structure is large enough so that the depletion region is not in contact with the source region and the drain region in a "off" state of the semiconductor structure, and
   wherein the first portion, the second portion, and the third portion are doped with a same type of dopants, and a dopant concentration in the first portion is greater than a dopant concentration in the second portion, and the dopant concentration in the second portion is greater than a dopant concentration in the third portion.

10. The semiconductor structure as claimed in claim 9, wherein the gate structure has a third length substantially equal to a length of the third portion of the nanowire structure.

11. The semiconductor structure as claimed in claim 10, wherein the second portion has a second length, and a ratio of the second length to the third length is in a range from about 0.1 to about 1.

12. The semiconductor structure as claimed in claim 9, wherein the first portion, the second portion, the third portion, the fourth portion, and the fifth portion are doped with the same type of dopants.

13. The semiconductor structure as claimed in claim 9, wherein the second portion and the fourth portion are configured to be long enough for the depletion region extending into the second portion and the fourth region without contacting with the source region and the drain region.

14. The semiconductor structure as claimed in claim 9, wherein a length of the depletion region in the first portion is smaller than a length of the depletion region in the second portion.

15. The semiconductor structure as claimed in claim 9, wherein the nanowire structure is a junctionless nanowire structure.

16. A method for forming a transistor structure, comprising:
    forming a nanowire structure over a substrate, wherein the nanowire structure has a first portion, a second portion, a third portion, a fourth portion, and a fifth portion;
    implanting a first type of dopants in the second portion, the third portion, and the fourth portion of the nanowire structure;
    forming a gate structure around the third portion of the nanowire structure;
    forming a spacer on the second portion of the nanowire structure; and
    forming a source region in the first portion of the nanowire structure adjacent to the spacer by implanting the first type of dopants in the source region, wherein a dopant concentration in the source region is greater than a dopant concentration in the second portion and the third portion of the nanowire structure,
    wherein a depletion region in the nanowire structure extends into the second portion under the spacer when the transistor structure is in its "off" state.

17. The method for forming a semiconductor structure as claimed in claim 16, wherein a length of the depletion region as no voltage is applied to the gate structure is no smaller than 1.05 times of a length of the gate structure.

18. The method for forming a semiconductor structure as claimed in claim 16, wherein the depletion region does not contact the source region.

19. The method for forming a semiconductor structure as claimed in claim 16, wherein the depletion region and the source region are separated by a portion of the nanowire structure when the transistor structure is at its "off" state.

20. The method for forming a semiconductor structure as claimed in claim 16, wherein a length of the spacer is configured to be great enough for the depletion region to extend under the portion of nanowire structure under the spacer without contacting the source region.

* * * * *